United States Patent [19]

Elsner et al.

[11] Patent Number: 4,611,089
[45] Date of Patent: Sep. 9, 1986

[54] THERMOELECTRIC CONVERTER

[75] Inventors: Norbert B. Elsner; John C. Bass, both of La Jolla; Charles C. Morris, San Diego, all of Calif.

[73] Assignee: GA Technologies Inc., San Diego, Calif.

[21] Appl. No.: 619,052

[22] Filed: Jun. 11, 1984

[51] Int. Cl.⁴ .................. H01L 35/02; H01L 35/30
[52] U.S. Cl. ................................ 136/230; 136/205; 248/1; 248/576
[58] Field of Search ............. 136/205, 230, 203, 204, 136/221, 224–227, 231–235; 62/3; 248/1, 576; 29/573

[56] References Cited

U.S. PATENT DOCUMENTS

| | | | |
|---|---|---|---|
| 2,980,746 | 4/1961 | Claydon | 136/4 |
| 3,070,644 | 12/1962 | Van Der Grinten et al. | 136/4 |
| 3,090,206 | 5/1963 | Anders | 62/3 |
| 3,096,545 | 7/1963 | Rowland | 18/17 |
| 3,240,628 | 3/1966 | Sonntag | 136/230 |
| 3,266,125 | 8/1966 | Tobolski | 29/155.5 |
| 3,400,452 | 9/1968 | Emley | 29/573 |
| 3,509,620 | 5/1970 | Phillips | 29/573 |
| 3,524,772 | 8/1970 | Purdy | 136/205 |
| 3,527,621 | 9/1970 | Newton | 136/203 |
| 3,546,025 | 12/1970 | Fredrick et al. | 136/205 |
| 3,714,539 | 1/1973 | Hampl | 136/205 |
| 4,032,363 | 6/1977 | Raag | 136/211 |

FOREIGN PATENT DOCUMENTS 912001 8/1961 United Kingdom.
1228287 4/1971 United Kingdom.

OTHER PUBLICATIONS

Design Status of the Improved Fossil Fired Thermoelectric Generator Program, by Bass and Elsner, published in Apr. 1982.

Primary Examiner—Thomas Wallen
Attorney, Agent, or Firm—Fitch, Even, Tabin & Flannery

[57] ABSTRACT

A thermoelectric converter includes a heat source having a mating face and a heat sink also having a mating face. The converter also includes a thermoelectric conversion module positioned between these faces. The module includes an electrically insulative holder having a first side positioned adjacent the heat source and a second side disposed adjacent the heat sink. The holder includes spaced parallel first walls and spaced parallel second walls extending normal to the first wall so that these first and second walls define an array of compartments with each compartment containing a thermoelectric element. The module further includes a compressed resilient, thermally conductive pad positioned in each compartment.

7 Claims, 7 Drawing Figures

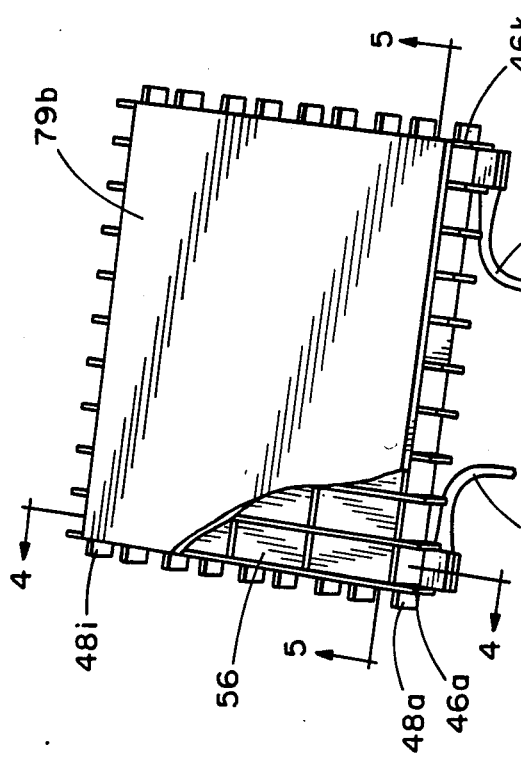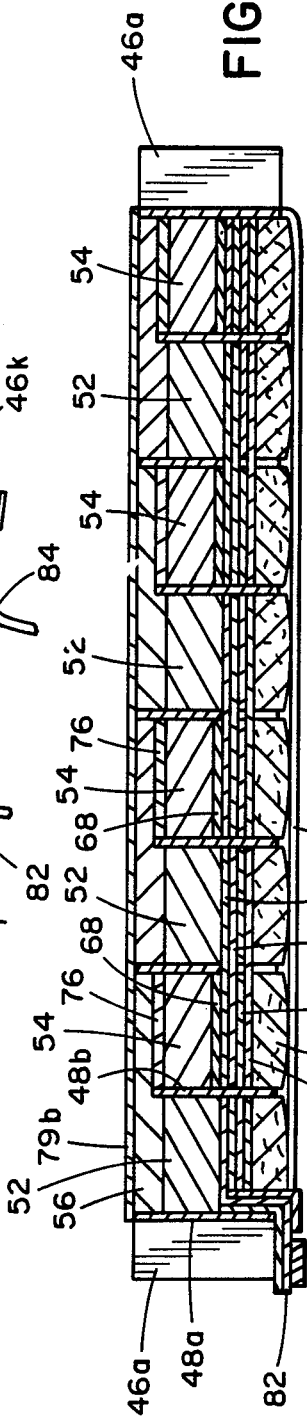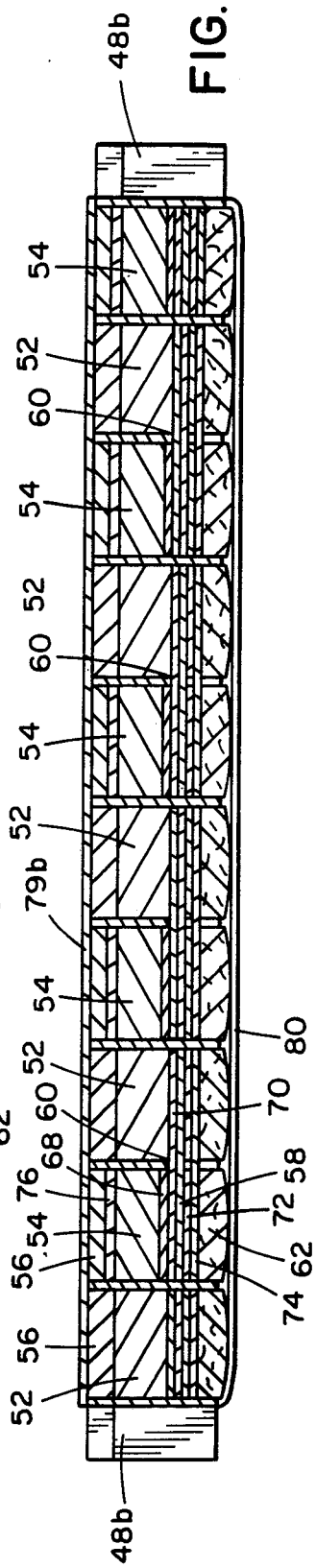

THERMOELECTRIC CONVERTER

The Government has rights in this invention pursuant to Contract DAAK 20-81-C-0431 awarded by the Department of Defense.

BACKGROUND OF THE INVENTION

The present invention relates to electrical power supplies, and more particularly, to a high efficiency thermoelectric converter.

Thermoelectric converters include an array of P-type and N-type thermoelectric elements electrically connected in series positioned in heat transfer relationship between a heat source and a heat sink. Due to the phenomenon of the Seebeck effect, these elements convert thermal energy to electrical energy.

Prior art thermoelectric converters incorporated holders of "egg-crate" construction defining open-ended compartments for receiving the various elements. The connecting straps used to series connect the elements engaged either the "hot side" (the side next to the heat source) or the "cold side" (the side next to the heat sink) of the holder. Accordingly, their positions with respect to the elements were fixed. If, due to manufacturing tolerances or differential thermal expansion, the conductive straps were not in firm contact with the elements, the efficiency of the module could be severely adversely effected.

In another prior art converter, no holder was used and an air space was provided between adjacent elements. In order to accommodate thermal expansion, a pivotal connection was provided between the element assembly and the heat source. Additionally, a heat sink was used having bores receiving spring loaded cold side element assembly components in a loose fit, to accommodate tipping of the element assembly. The tipped joint and the coiled spring reduced heat transfer through the elements. For further information concerning the structure and operation of such prior art thermoelectric converters, reference may be made to U.S. Pat. No. 2,980,746 and British Patent Nos. 912,001 and 1,228,287.

SUMMARY OF THE INVENTION

Among the several aspects of the present invention may be noted the provision of an improved thermoelectric converter having high efficiency and light weight. The converter incorporates a compartmentalized holder permitting high density packaging of the various thermoelectric elements and allowing all series connections of the elements held to be made within the envelope of the holder. The converter also compensates for differences in element height due to manufacturing tolerances or differential thermal expansion by maintaining the elements in compression between the heat source and the heat sink. The converter also is reliable, has long service life and is simple and economical to manufacture. Other objects and features will be, in part, apparent and, in part, pointed out hereinafter in the following specification and attendant claims and drawings.

Briefly, the converter of the present invention includes a heat source, a heat sink, and a thermoelectric conversion module. The heat source and heat sink each have mating faces, and the module is positioned between the faces. The module includes an electrically insulative holder having a hot side positioned adjacent the heat source and a cold side disposed adjacent the heat sink. The holder includes spaced parallel first walls and spaced parallel second walls extending normal to the first walls and defining therewith an array of compartments, each containing a thermoelectric element. The module also includes a compressed, resilient, thermally conductive pad positioned in each compartment.

BRIEF DESCRIPTION OF THE DRAWINGS

FIG. 3 is a perspective view of a completed module;

FIG. 4 is a sectional view taken generally along line 4—4 of FIG. 3;

FIG. 5 is a sectional view taken generally along line 5—5 of FIG. 3;

Corresponding reference characters indicate corresponding components through the several views of the drawings.

DESCRIPTION OF THE PREFERRED EMBODIMENT

Figure 6:
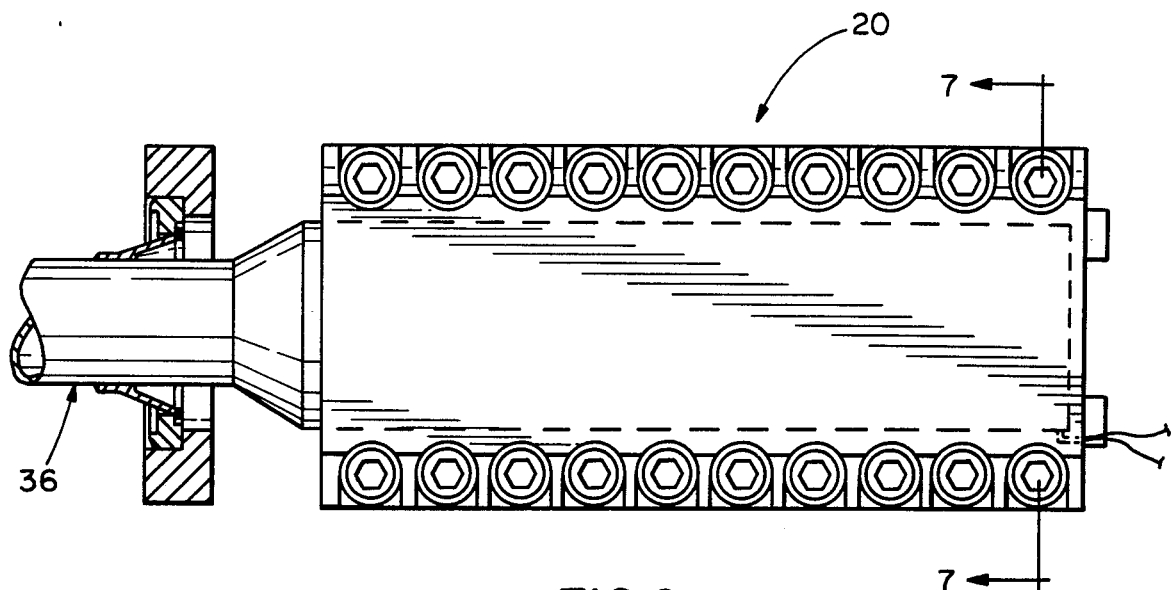
FIG. 6 is a side elevational view of a completed thermal converter including the module of FIG. 1 mounted on a heat source.
Figure 7:
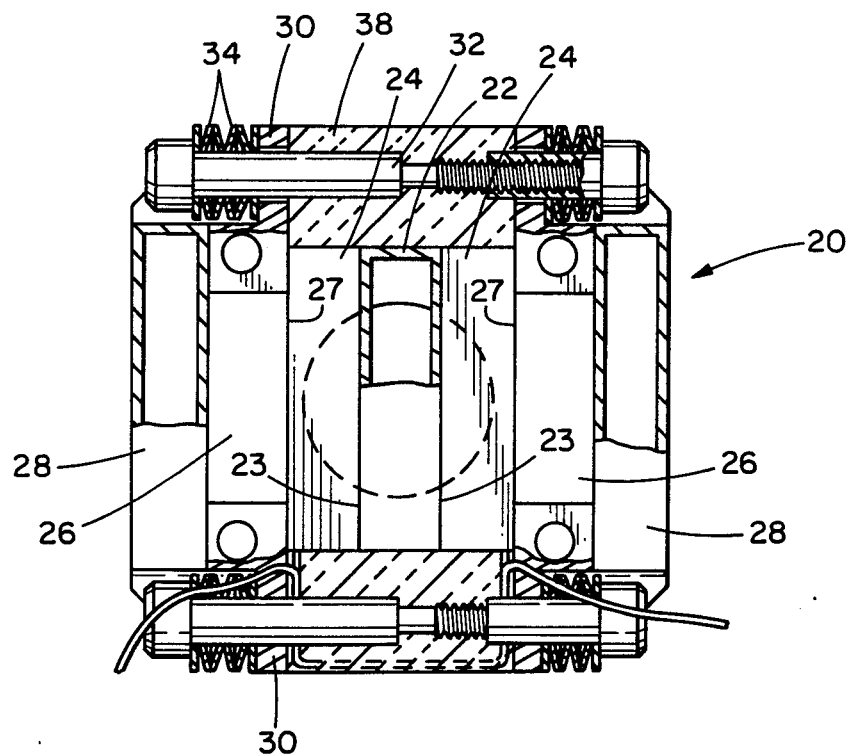
FIG. 7 is a sectional view of the converter of FIG. 6 taken generally along line 7—7 of FIG. 6 with certain components not shown in section.

Referring now to the drawings, a thermoelectric converter of the present invention is generally indicated in FIGS. 6 and 7 by reference character 20. The converter includes a central heat source 22 having flat sides 23. Disposed outwardly from each of the flat sides of the heat source is a thermoelectric conversion module 24, a heat sink 26 having a generally flat side 27 engaging the module, and a can 28 filled with a low thermal conductivity inert gas to prevent excessive heat loss. Each heat sink has a pair of opposed apertured mounting flanges 30 receiving clamping bolts 32 to hold the converter in its assembled condition. Spring means, in the form of Belleville washers 34, are used beneath the bolt heads to bias the heat sinks against the facing module surface. Insulative blocks 38 are positioned against the remaining sides of the heat source 22 and the modules 24 to further reduce losses.

The heat source 22 could be the condenser section of a heat pipe 36, the evaporator section of which extends into a burner assembly. See commonly assigned U.S. patent application Ser. No. 618,991, filed June 11, 1984, for a description of a thermoelectric conversion system including a burner assembly for heating such pipes.

Figure 1:
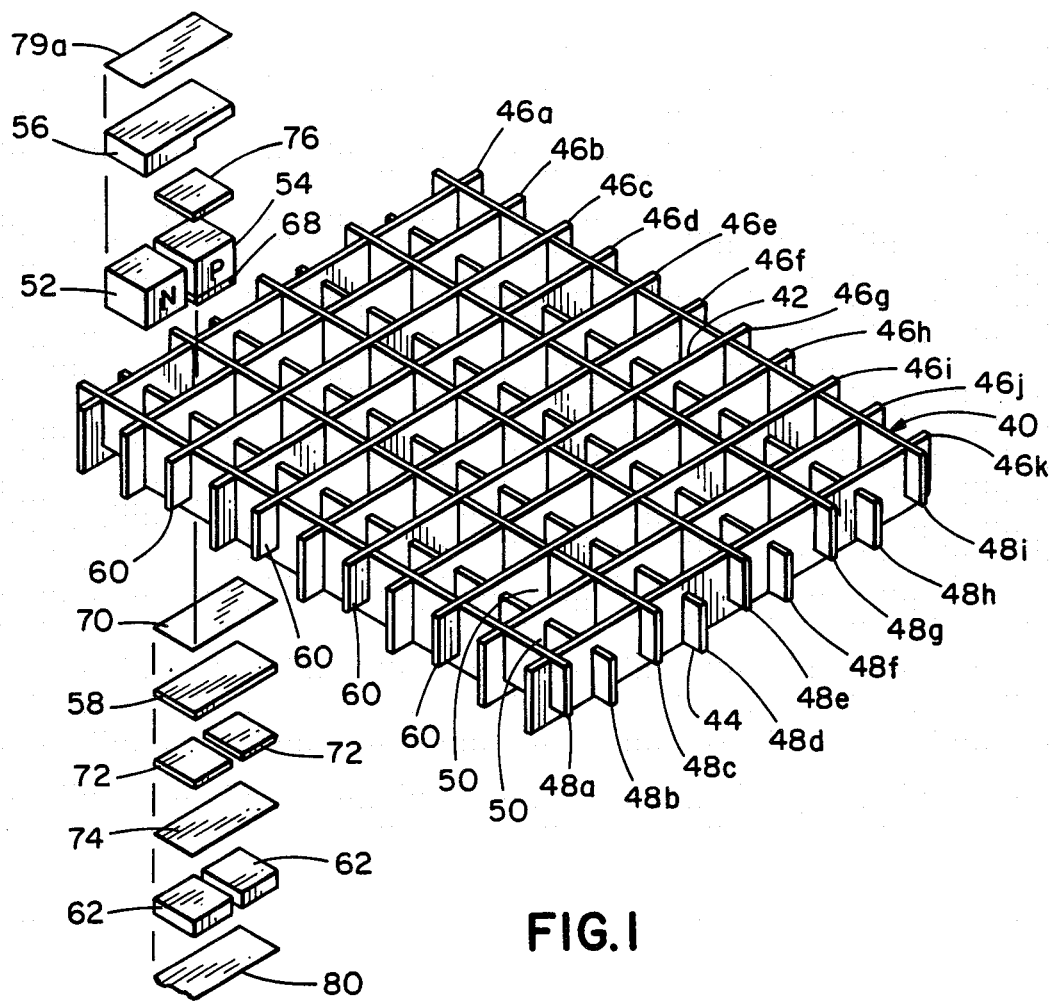
FIG. 1 is an exploded isometric view of components of a thermoelectric conversion module according to the present invention.

As best shown in FIG. 1, the module 24 includes a thermally and electrically insulative holder 40, preferably formed of mica, for retaining a plurality of thermoelectric element assemblies and permitting electrical series connection within the envelope of the holder. More specifically, the holder 40 has a first or hot side 42 and a second or cold side 44, and includes a plurality of spaced, parallel first walls 46a–46k which extend from the hot side to the cold side. The holder also has a number of spaced, parallel second walls 48a–48i extending normal to the first walls and defining therewith an array of compartments 50. Each compartment 50 contains a thermoelectric element. N-type thermoelectric elements 52 and P-type thermoelectric elements 54 are arranged in pairs. Adjacent first walls define columns of four thermoelectric element pairs while adjacent second walls form rows with opposite type elements being positioned next to each other.

Every other second wall (48a, 48c, 48e, 48g and 48i) extends to the hot side 42 of the holder but terminates short of the cold side 44. On the other hand, the remaining second walls (48b, 48d, 48f and 48h) extend to the cold side 44 of the holder but terminate short of the hot side. This arrangement permits both elements in a pair and each pair of elements in a column to be series connected within the envelope of the holder, i.e., between sides 42 and 44. The module 24 includes hot side conductors 56 series connecting elements within a pair on the hot side of the holder. The module further includes cold side conductors 58 series connecting N and P type elements of adjacent pairs adjacent the cold side of the holder, as best shown in FIG. 4.

Each interior first wall 46b–46j includes a relieved portion 60 with adjacent first walls having their relieved portions at opposite ends of the columns on the cold side of the holder. Referring to FIG. 5, the provision of the relieved portions at alternating ends of adjacent columns permits the columns of pairs of thermoelectric elements to be connected in series by the conductors 58, also within the envelope of the holder.

Disposed in each compartment with a thermoelectric element and adjacent the cold side of the holder is a resilient, thermally conductive pad 62. When the converter is assembled, each pad is compressed for pushing its respective commonly compartmentalized element and other components together, assuring good thermal and electrical contacts. Each pad is generally rectangular in plan and is sized to substantially plug the compartment in which it is disposed. Each pad is preferably formed of a fiber metal felt such as of copper. The pads, due to their resiliency, compensate for differences in the heights of the elements 52 and 54 which could be due to manufacturing tolerances, differential thermal expansion or differential creep of the thermoelectric material, preferably PbTe. The pads 62 are compressed by the force provided by the Belleville washers 34 which act on the heat sink and compress the module 24 between the heat sink and the heat source.

Figure 2:
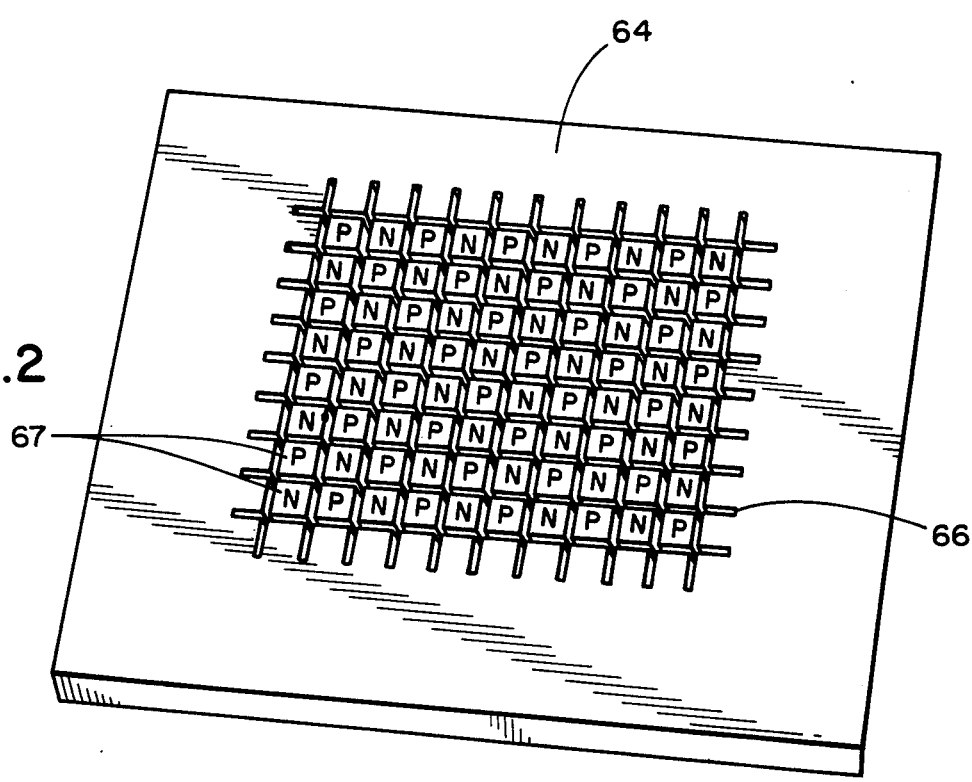
FIG. 2 is a perspective view of a jig plate used in the assembly of the conversion module of FIG. 1.

The thermoelectric conversion module 24 is assembled using a jig plate 64, shown in FIG. 2, having an array 66 of intersecting grooves for seating the various first and second walls of the holder 40. The jig plate also has an array of rectangular platforms 67, defined by the grooves, for extending into the holder compartments 50 to locate the elements 52, 54.

After the N and P-elements 52 and 54 of the prescribed cross sectional area, sufficient to substantially fill each compartment 50, are cut to the desired length, the P-type elements are ion-plated with a three to five mils coating 68 of SnTe on the cold side thereof. The purpose of this coating is to prevent interaction of a subsequently installed Pb foil 70 and the P-type PbTe element 54. Such interaction would result in the diffusion of lead from the foil into the element thereby causing it to be transformed into an N-type element. The holder 40, which electrically insulates each element 52, 54, is placed on the jig plate 64 with the various platforms 67 thereof serving to locate the elements in the compartments of the holder.

The Pb foil 70 joining adjacent pairs is loaded. It is noted that this foil is compatible with both the N-type, PbTe element and the P-type element having the facing side thereof coated with SnTe. The foil forms a low contact resistance bond with these materials. Additionally, the foil 70 acts as a diffusion barrier to prevent copper migration into the PbTe or SnTe. If this migration were allowed to occur, degradation of the thermoelectric conversion elements would result. Next the cold side conductors 58, preferably formed of copper, are loaded to bridge an N-type element and a P-type element of adjoining pairs of elements. The element assemblies also include electrical insulators 72, preferably of aluminum oxide, to isolate the elements electrically from further cold side components. It is noted that aluminum oxide, while being a good electrical insulator, is thermally conductive. A second Pb foil 74 is used to provide improved thermal contact between the aluminum oxide insulators 72 and the copper fiber metal pads 62. The pads 62 function to provide individual spring loading of the elements 52, 54 to hot and cold side electrical conductors. In addition to their high spring rate, the pads additionally have high thermal conductivity to minimize the temperature difference between the heat sink and the thermoelectric cold junction.

After the partially assembled module is removed from the jig plate 64 and inverted, a graphite spacer 76 is positioned on each P-type element 54. Graphite is compatible with the P-type PbTe and is needed since most metals react with this P-type material (which is Te rich) to form tellurides with the P-type PbTe. Such telluride depletion results in degradation of the thermoelectric properties of the P-type elements.

Next the hot conductors 56 are loaded which series connect N-type and P-type elements within each element pair. The hot conductor is preferably made of Fe because this material is compatible with the N-type PbTe (which is Pb rich) and graphite. The hot conductor 56 is made sufficiently thick to insure its service as a good electrical conductor. One particularly advantageous feature of Fe is that the conductors 56 are able to be easily manufactured using powder metallurgy techniques. It is noted that other materials such as molybdenum can be used in lieu of the Fe.

The module 24 also includes a hot side electrical insulator, also preferably of aluminum oxide, to isolate the hot conductor from the heat source, which may be made of an electrically conductive material. Boron nitride could also be used for the hot side insulator. The hot side insulator could either be in the form of small rectangular pieces 79a (shown in FIG. 1) for covering individual hot conductors or the hot side insulator could be formed of a sheet 79b (shown in FIGS. 3–5) which would cover the entire hot side of the holder. It is noted that preferably another Pb foil 80 is used between the heat sink and the pads 62.

The assembled module 24 is processed by elevating its temperature to about 250° C. in an inert atmosphere while evenly compressing it approximately four mils. This assembly step seats the various mating surfaces so that low resistance contacts are formed. The module 24 is compressively loaded between the flat side 23 of the heat source 22 and the flat side 27 of the heat sink 26. When operated at a heat source temperature of approximately 570° C. and a heat sink temperature of approximately 100° C., the modules 24 have been found to yield approximately 42 watts at about 5 volts. This indicates that parasitic extraneous resistance losses are less than 10%. The converter 20 shown in FIGS. 6 and 7 employs a total of six thermoelectric modules 24. Three are positioned on each side of the heat source and all six are series connected which causes the yield of the converter to be approximately 250 watts. Each module has insulated leads 82, 84 connected to the elements at one end on the columns formed by walls 46a and 46b and 46j and 46k, respectively, to enable convenient series connection of the various modules in a converter.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A thermoelectric converter comprising:
   a heat source having a mating face;
   a heat sink having a mating face; and
   a thermoelectric conversion module disposed between said heat source and said heat sink and engaging said faces, said module including a plurality of thermoelectric elements, and an electrically insulative holder, said holder having a first side disposed adjacent said heat source and a second side disposed adjacent said heat sink;
   said holder comprising a plurality of spaced, parallel first walls and a plurality of spaced, parallel second walls extending normal to said first walls and defining therewith an array of compartments each containing a respective said thermoelectric element,
   said module further comprising a compressed resilient, thermally conductive pad positioned in each compartment, said first walls defining columns of element pairs, each pair including a P-type thermoelectric element and an N-type thermoelectric element, said first walls extending from said first side to said second side, said second walls defining rows of elements with adjacent elements in a row being of opposite type, every other of said second walls extending to said first side but short of said second side, with the remaining second walls extending to said second side but short of said first side, whereby each column of elements can be electrically series connected within the envelope of said holder.

2. A converter as set forth in claim 1 wherein portions of said first walls are relieved adjacent column ends to permit columns to be electrically series connected within the envelope of said holder.

3. A converter as set forth in claim 1 further comprising spring means for biasing said heat sink against the second side of said module.

4. A converter as set forth in claim 1 wherein each pad is generally rectangular and is sized substantially to plug the compartment in which it is disposed.

5. A converter as set forth in claim 1 wherein said elements include lead telluride.

6. A converter as set forth in claim 1 wherein said pads are made of copper.

7. A holder for use in a thermoelectric conversion module, said holder being formed of an electrically insulative material and comprising:
   a plurality of spaced parallel first walls; and
   a plurality of spaced parallel second walls extending normal to said first walls and defining an array of compartments for receiving thermoelectric elements,
   said holder having a first side for disposition adjacent a heat source and a second side for positioning adjacent a heat sink, said first walls defining columns and extending from said first side to said second side,
   said second walls defining rows of elements with every other of said second walls extending to said first side but short of said second side, with the remaining second walls extending to said second side but short of said first side,
   predetermined portions of said first walls being relieved adjacent column ends whereby all said elements can be series connected between said first side and said second side.

* * * * *